United States Patent

[11] 3,631,260

[72] Inventor Hirokazu Yoshino
Osaka, Japan
[21] Appl. No. 865,406
[22] Filed Oct. 10, 1969
[45] Patented Dec. 28, 1971
[73] Assignee Matsushita Electric Industrial Co., Ltd.
Osaka, Japan
[32] Priority Oct. 15, 1968
[33] Japan
[31] 43/75767

[54] LOGIC CIRCUIT
6 Claims, 10 Drawing Figs.

[52] U.S. Cl. .......... 307/206, 307/258, 307/274
[51] Int. Cl. .......... H03k 19/08
[50] Field of Search .......... 307/206, 258, 286, 274

[56] References Cited
UNITED STATES PATENTS

| | | | |
|---|---|---|---|
| 3,105,159 | 9/1963 | Ditkofsky | 307/206 |
| 3,175,097 | 3/1965 | Lewin | 307/206 |
| 3,162,771 | 12/1964 | Hilsenrath et al. | 307/258 X |
| 3,225,217 | 12/1965 | Corney | 307/274 X |
| 3,458,733 | 7/1969 | Kosonocky | 307/274 X |

*Primary Examiner*—Donald D. Forrer
*Assistant Examiner*—B. P. Davis
*Attorney*—Stevens, Davis, Miller & Mosher

ABSTRACT: An Esaki diode and a high-conduction diode are connected in parallel across the base-collector junction of a transistor junction of a transistor to constitute a logic circuit. The input-output curve of this transistor shows a hysteresis characteristic and the transition of the output state can be done in a very short time with stable operation. Connection of a plurality of such logic circuits in a ring provides a frequency divider circuit operating at a high speed. Combination of a plurality of such logic circuits with delay elements constitutes an astable, monostable, bistable multivibrator or other high-speed logic circuit.

FIG. 1
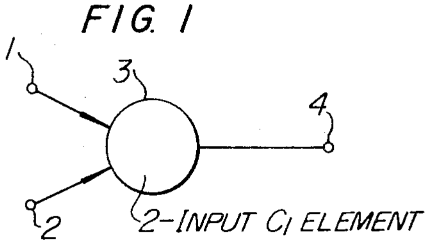
FIG. 2
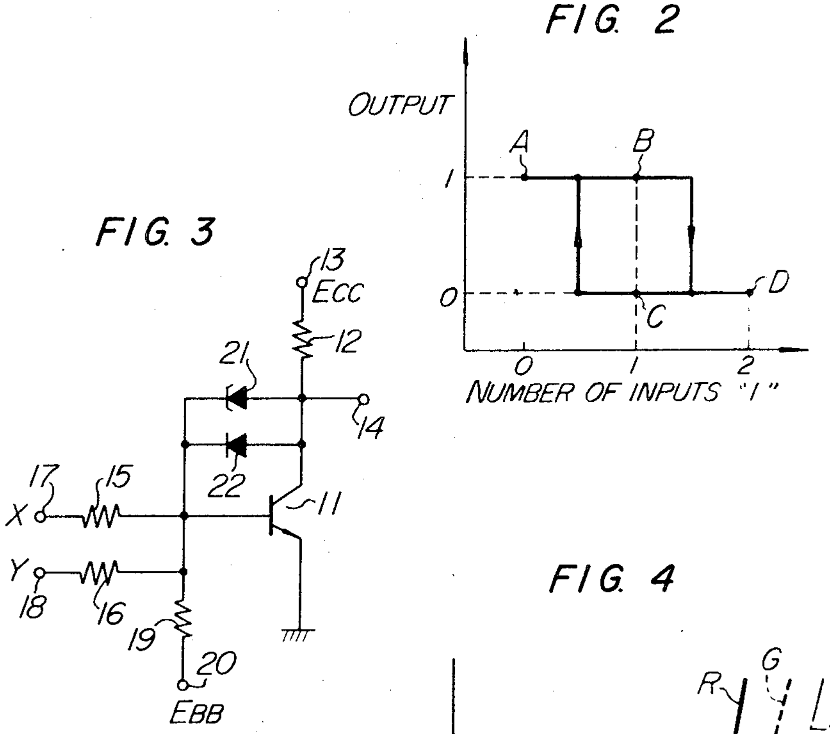
FIG. 3
FIG. 4
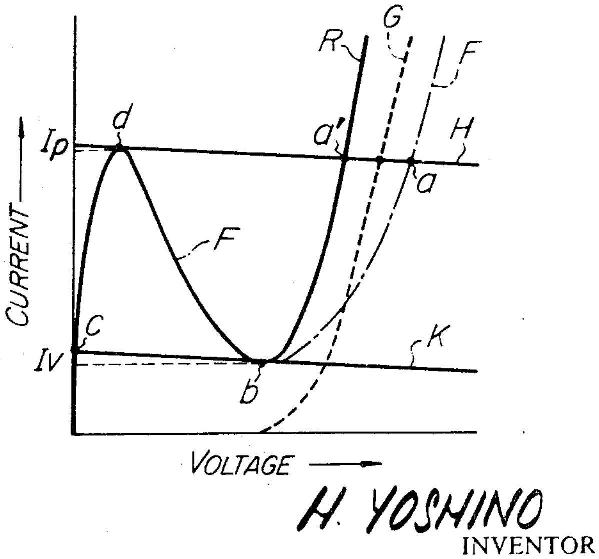
H. YOSHINO
INVENTOR
BY
ATTORNEY FIG. 7
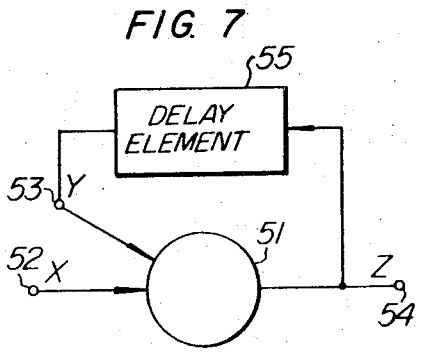
FIG. 8
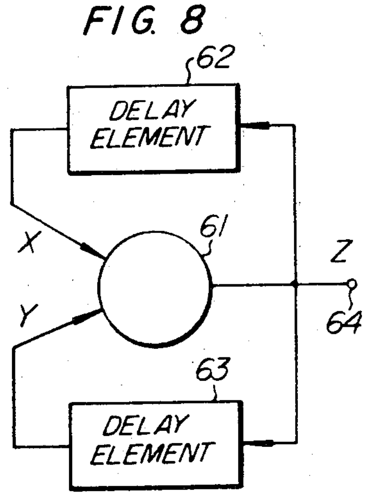
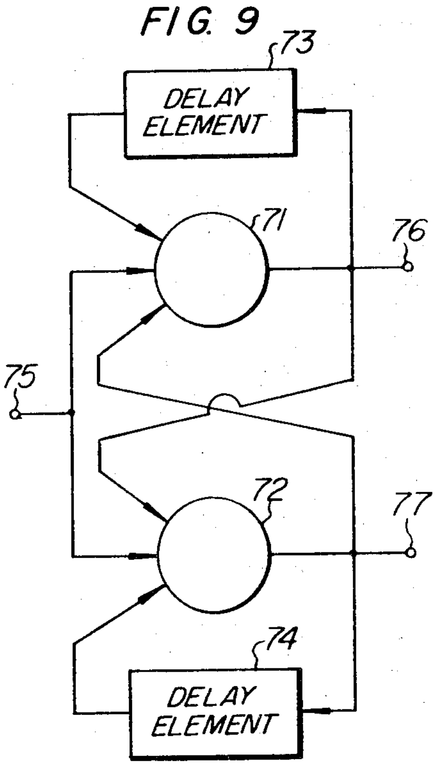
FIG. 10
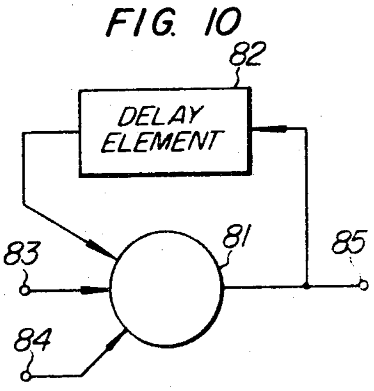

LOGIC CIRCUIT

This invention relates to a logic circuit which carries out a logical operation at high speed.

Conventionally, logic circuits are formed of active elements such as transistors and passive elements such as resistors and capacitors. Combinations of these circuits provide circuits of various logic. However, when an active element is used to perform a switching action, the addition of a passive element reduces the performance of the active element and makes it work at a speed far lower than its highest operable speed.

An object of the invention is to realize the speedup of a logical operation of such logic circuits by fully utilizing the ability of a transistor.

Another object of the invention is to largely increase the operation speed of a logic composed of a plurality of such logic circuits with or without passive elements.

This invention is based on the fact that when an Esaki diode (tunnel diode) is connected in parallel with the base-collector junction of a switching transistor the switching action is dominated by the rise or fall time of the tunnel diode.

Now, the invention will be described hereinafter in various embodiments with reference to the drawings in which:

FIG. 1 is a block diagram of a logic circuit of the invention;

FIG. 2 is an illustrative input-output curve of the logic circuit of FIG. 1;

FIG. 3 is an electrical network of an embodiment of a logic circuit of the invention;

FIG. 4 is a current-voltage curve of the circuit of FIG. 3;

FIGS. 7 to 10 show other embodiments of the invention.

Figure 5:
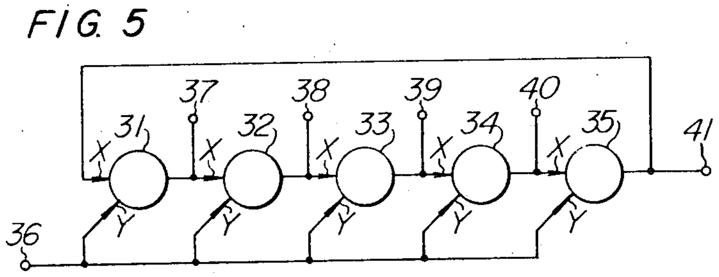
FIG. 5 is a block diagram of an embodiment of a frequency divider formed of a cascade connection of the circuits of FIG. 3.

Before the description of the embodiments of the invention, the principle thereof will be described hereinafter.

We define here that an element having such a logical function that its output is "1" when less than *l* inputs are "1" among all *m* inputs, equal to the preceding output before the arrival of inputs when *l* inputs are "1," and "0" when more than *l* inputs are "1" be called an "*m*-input C element." The simplest one of these *m*-input C elements, i.e. "2-input $C_1$ element," will be described in connection with FIG. 1.

When inputs X and Y are supplied to input terminals 1 and 2 of a 2-input $C_1$ element 3, an output Z appears at an output terminal 4 in accordance with the inputs X and Y. Namely, when both of the inputs X and Y are "0," the output Z is "1." When one input is "0" and the other is "1," the output Z maintains the output Zo before the arrival of such inputs. When both of the inputs X and Y are "1," the output Z becomes "0." These logical operations are summarized in the following table.

| Input X | Input Y | Output Z |
|---|---|---|
| 0 | 0 | 1 |
| 0 | 1 | Zo |
| 1 | 0 | Zo |
| 1 | 1 | 0 |

Such a relationship is illustrated in FIG. 2. Point A represents the state when the input (X, Y) is (0, 0), i.e. the number of inputs "1" is zero. Points B and C represent the state when the input (X, Y) is (1, 0) or (0, 1). And point D represents the state when the input (X, Y) is (1, 1). Thus, the curve ABDCA shows a hysteresis property.

FIG. 3 shows an embodiment of 2-input $C_1$ element of the invention. In the figure, an NPN-transistor 11 has its collector connected with a voltage supply terminal 13 through a collector resistance 12 and with an output terminal 14, its base connected with input terminals 17 and 18 through resistances 15 and 16 respectively, and its emitter grounded. The base is also connected with a terminal 20 through a base resistance 19 to be supplied with a bias voltage. A parallel connection of a tunnel diode 21 and a high-conduction diode 22 of the same orientation has its anode side connected with the collector of the transistor 11 and its cathode side connected with the base. The high-conduction diode 22 is a diode having a current verses voltage characteristic whose rising slope is steeper than that of a tunnel diode within a voltage range exceeding that which shows a negative resistance characteristic, as shown in FIG. 4. In the construction described above, the transistor 11 is always biased to be conductive.

Putting the forward base-emitter voltage drop of the transistor 11 as $V_{EB}$ and the forward high voltage of the tunnel diode 21 as $V_{DM}$, the voltage $V_o$ always appearing at the output terminal 14 can be written as $V_o = V_{EB} + V_{DM}$ The input impedance seen from the base of the transistor 11 is much reduced by the large voltage feedback through the tunnel diode 21 to become approximately equal to the emitter resistance $r_e$ of the transistor 11. Similarly, the output impedance is approximately equal to the emitter resistance $r_e$ by the voltage feedback. Therefore, when such circuits are connected in cascade, the transistor of the latter stage is driven at a potential approximately equal to the initial input voltage so that it operates as fast as the limit of its figure of merit. If the coupling resistors 15 and 16 and the base resistance 19 are selected to be large compared with the emitter resistance $r_e$, a very high speed threshold logic circuit in which the input and output side can be fairly separated.

First, the case in which the diode 22 is omitted in FIG. 3 will be described in connection with FIG. 4.

In FIG. 4, curves F and G represent the characteristics of the tunnel diode and the diode, respectively. When the input (X, Y) applied to the input terminals 17 and 18 is (0, 0), the tunnel diode 21 is in the high-voltage state and operates at the intersections (*a*) with a load curve H. In this state, the output is "1."

When the input (X, Y) is altered to (1, 0) or (0, 1), the operating point tends to shift from the point (*a*) to the point (*b*) when the curve F contacts a load line K.

However, the operating point never passes over the point (*b*) into the negative resistance region but remains between the points (*a*) and (*b*). When the input of "1" is removed, the operating point returns to the point (*a*).

When the input (X, Y) becomes (1, 1), the operating point passes over the point (*b*) into the negative resistance region and rapidly shifts to the intersection (*c*) with the load line K. In this state, the output is "0." If the input (X, Y) varies from (1, 1) to (1, 0) or (0, 1), the operating point tends to shift to the point (*d*) where the curve F contacts the load line H, but the output remains "0." Thus this circuit preforms a threshold logical operation with a hysteresis width Ip-Iv of the tunnel diode.

In actual construction, the diode 22 is connected in parallel to the tunnel diode with the same orientation so that the real characteristic of the circuit is represented by a curve R. The curve R has a steeper slope than the curve F of the tunnel diode and the state represented by the point (*a*) shifts to a point (*a'*). The steeper slope means that the fall time i.e., the time needed for the output to change from "1" to "0," is greatly reduced. Thus, the switching action of the tunnel diode 21 becomes more rapid due to the diode 22 and the transistor 11 operates at a rate approximately equal to the limit of its performance index. Further, when a current larger than the peak current Ip of the tunnel diode happens to flow, the excess part can bypass the tunnel diode 21 to the diode 22. Thus the Esaki diode can be protected from deterioration and breaking down due to overloading.

FIG. 5 shows the one to five frequency divider circuit that is an application of such circuits according to the invention. In the figure, five 2-input $C_1$, elements 31 to 35 having the configuration of FIG. 3 are connected in cascade with each input terminal of each element being connected to the common input terminal 36. Reference numerals 37 to 41 represent output terminals of respective elements and the output terminal 41 of the last stage element 35 is connected to the input terminal of the first stage element 31.

When an input signal is supplied to the input terminal 36 of such a frequency divider circuit, the following outputs appears at the output terminals 37 to 41.

| | Output | | | | |
|---|---|---|---|---|---|
| Input | 37 | 38 | 39 | 40 | 41 |
| 0 | 1 | 1 | 0 | 1 | 0 |
| 1 | 1 | 0 | 0 | 1 | 0 |
| 0 | 1 | 0 | 1 | 1 | 0 |
| 1 | 1 | 0 | 1 | 0 | 0 |
| 0 | 1 | 0 | 1 | 0 | 1 |
| 1 | 0 | 0 | 1 | 0 | 1 |
| 0 | 0 | 1 | 1 | 0 | 1 |
| 1 | 0 | 1 | 0 | 0 | 1 |
| 0 | 0 | 1 | 0 | 1 | 1 |
| 1 | 0 | 1 | 0 | 1 | 0 |
| 0 | 1 | 1 | 0 | 1 | 0 |
| . | . | . | . | . | . |
| . | . | . | . | . | . |
| . | . | . | . | . | . |
| . | . | . | . | . | . |
| . | . | . | . | . | . |

As is clear from the above table, logical output (1, 1), as is indicated with an underline, of the mutually adjacent elements with an output "0" for the preceding element shifts to (1, 0) by an input of "1" and similarly logical output (0, 0) with "1" for the preceding output changes into (0, 1) by an input of "0." Thus, the output (1, 1) or (0, 0) gradually shifts to the right side by repetitive inputs.

Figure 6:
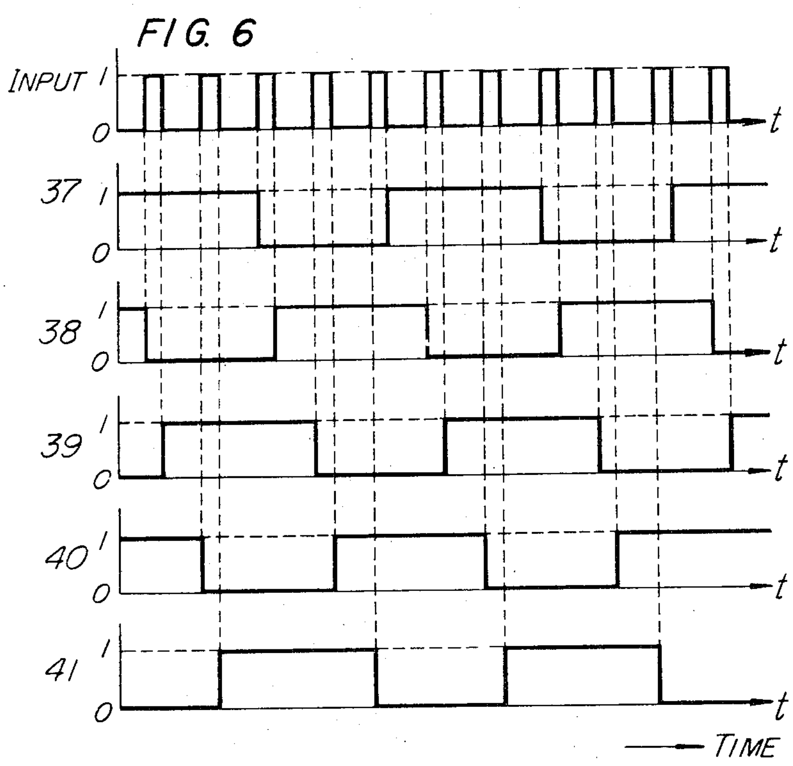
FIG. 6 illustrates the operation of the circuit of FIG. 5.

FIG. 6 shows the input and output pulse trains given in the above table and appearing at the terminals 37 to 41. Regarding the output at the terminal 37, provided that it has changed from "1" to "0" by the arrival of the first pulse, it returns to "1" just after the arrival of the third pulse and again changes into "0" by the arrival of the sixth pulse. These changes are same for the other inputs.

In frequency divider circuits of such construction, the extreme value of the divided frequency is mainly determined by either the rise or fall time of the tunnel diode. The rise time of a tunnel diode is short and the fall time is shortened by the parallelly connected diode, therefore the threshold action can be performed very rapidly. Further, the operation is stable and reliable and the construction is relatively simple. Thus, the invention can be applied to various devices comprising a logic circuit such as counters.

FIG. 7 shows a monostable multivibrator the output of which performs a steep rising and falling. In the figure, the multivibrator comprises a logic circuit 51 having the configuration of FIG. 3 with input terminals 52 and 53 and an output terminal 54. The output terminal 54 is connected to an input terminal 53 through a delay element 55 to feed back the output to the input terminal 53 with a delay of $\tau$. Before the beginning of the operation, when the input X to be applied to the input terminal 52 is "0," the output appearing at the output terminal 54 is "1." Namely, if the output Z is "0," the input terminal 53 is applied with an input Y of "0." As previously described, when the input (X, Y) is (0, 0) the output Z gives "1." The change of the output Z is transmitted to the input Y through the delay element with a delay time of $\tau$. Namely, after the time of $\tau$, the input Y changes to be "1." If the other input X remains to be "0," the output Y also remains in the state of "1." When a pulse signal of value "1" and very narrow width is applied to the terminal 52 to change the input Y to "1" for a short duration, the input (X, Y) becomes (1, 1) to give an output of "0." If the input X is also changed to "0" in said duration, the input (X, Y) becomes (0, 0) after the passage of the pulse and the output Z returns to the state of "1."

FIG. 8 shows an astable multivibrator in which a logic circuit 61 of the configuration of FIG. 3 has an output 64 with feedback lines through delay elements 62 and 63 to the inputs X and Y. The elements 62 and 63 have delay times of $\tau_1$ and $\tau_2$ respectively. When the input (X, Y) is (0, 0) and the output Z shifts from "0" to "1," this change is fed back to the input terminals 62 and 63 with delay times of $\tau_1$ and $\tau_2$. If the delay time $\tau_1$ is shorter than the delay time $\tau_2$, the input X changes from "0" to "1" after the time of $\tau_1$. At this moment, the input Y is still "0" and the output Z remains the state of "1." When the time of $\tau_2$ elapses after the output change, the input Y changes from "0" to "1" to change the output Z from "1" to "0." This output change causes changes of the inputs X and Y in a similar manner. Thus the multivibrator generates pulse trains at the output terminal 64 with a period of $2\tau_2$. It is apparent that this period is determined by the larger one of delay times $\tau_1$ and $\tau_2$.

FIG. 9 shows a bistable multivibrator which comprises two logic circuits 71 and 72 of the configuration of FIG. 3 and delay elements 73 and 74 for transmitting the output to the input terminals with a certain delay. The circuits 71 and 72 have three input terminals for each and each one of remaining two input terminals of each circuit is connected to a terminal 75 to be applied with a common pulse signal. The other input of each circuit is directly connected to the output terminal 76 or 77. This logic circuit gives an output of "0" when all three inputs are "1," and an output of "1" when all three inputs are "0." If one input of a circuit is different from the other two inputs, the output maintains the value of the preceding state.

FIG. 10 shows an inhibition gate circuit which comprises a logic circuit 81 of the configuration of FIG. 3 and a delay element 82 feeding back the output to one of three input terminals. This circuit gives an output of "1" at an output terminal 85 only when both the two input terminals 83 and 84 are simultaneously driven with pulse signals. The delay element 82 is provided to work as a reset.

In the circuits described above, a tunnel diode and a high-conduction diode in a parallel connection make the rise and fall time of the output very steep so that the output forms square pulse trains. Further, since the operating rate of a circuit is mainly determined by the delay time of a delay element, the delay time can easily be greatly shortened and the response lag can be extremely minimized to enable the response to a signal of several hundred megahertz to about a thousand megahertz.

What is claimed is:

1. A logic circuit comprising a transistor having a base and an output terminal, a parallel connection of a tunnel diode and a high-conduction diode having the same polarity and connected across a junction between the base and the output terminal of said transistor with said polarity being opposite to that of said junction, said high-conduction diode having a current versus voltage characteristic whose rising slope is steeper than that of said tunnel diode within a voltage range exceeding that which shows a negative resistance characteristic, and a plurality of input terminals connected with the base of said transistor.

2. A logic circuit comprising a plurality of units, each unit comprising a transistor having a base and an output terminal, a parallel connection of a tunnel diode and a high-conduction diode having the same polarity and connected between said output terminal and said base with said polarity opposite to the junction between said base and said output terminal, said high conduction diode having a current versus voltage characteristic whose rising slope is steeper than that of said tunnel diode within a voltage range exceeding that which shows a negative resistance characteristic, and a first and a second input terminal connected with the base of said transistor, said units being connected in series with said first input terminals connected to a common input terminal and said second input terminals connected to the output terminal of the preceding unit so as to have a frequency-dividing function.

3. A logic circuit comprising two circuit units, each comprising a transistor having a base and an output terminal with a junction therebetween, a parallel connection of a tunnel diode and a high-conduction diode of the same polarity connected between said base and output terminal with said polarity being opposite to said junction, and three input terminals connected to the base of said transistor;

a delay element connected between said output terminal and one of said input terminals of each unit, another one of said input terminals of each unit being connected to said output terminal of the other unit, and the other one of said input terminals of each unit being supplied with a common input signal.

4. A logic circuit comprising a transistor having a base and an output terminal, a parallel connection of a tunnel diode and a high-conduction diode having the same polarity and connected across a junction between the base and the output terminal of said transistor with said polarity being opposite to that of said junction, a plurality of input terminals connected with the base of said transistor, and at least one delay element connected between said output terminal and one of said input terminals.

5. A logic circuit comprising a transistor having a base and an output terminal, a parallel connection of a tunnel diode and a high-conduction diode having the same polarity and connected across a junction between the base and the output terminal of said transistor with said polarity being opposite to that of said junction, a plurality of input terminals connected with the base of said transistor, and at least two delay elements having different delay time, each being connected between said output terminal and respective one of said input terminals.

6. A logic circuit comprising a transistor having a base and an output terminal, a parallel connection of a tunnel diode and a high-conduction diode having the same polarity and connected across a junction between the base and the output terminal of said transistor with said polarity being opposite to that of said junction, a plurality of input terminals connected with the base of said transistor, and a delay element connected between said output terminal and one of said input terminal, the other of said input terminals being applied with an independent input.

* * * * *

UNITED STATES PATENT OFFICE
CERTIFICATE OF CORRECTION

Patent No. 3,631,260 Dated December 28, 1971

Inventor(s) Hirokazu YOSHINO

It is certified that error appears in the above-identified patent and that said Letters Patent are hereby corrected as shown below:

In the Claim for Convention Priority, one of the two Japanese application is omitted and should be included as follows:

--Japan, Patent Appln. N° 75768/68 filed October 15, 1968. --.

Signed and sealed this 27th day of June 1972.

(SEAL)
Attest:

EDWARD M.FLETCHER,JR.
Attesting Officer

ROBERT GOTTSCHALK
Commissioner of Patents

FORM PO-1050 (10-69)

USCOMM-DC 60376-P69
☆ U.S. GOVERNMENT PRINTING OFFICE : 1969 O—366-334